(12) United States Patent
Yamakawa et al.

(10) Patent No.: US 10,031,243 B2
(45) Date of Patent: Jul. 24, 2018

(54) PHOTON COUNTING DETECTOR

(71) Applicant: JOB CORPORATION, Kanagawa (JP)

(72) Inventors: Tsutomu Yamakawa, Kanagawa (JP); Shuichiro Yamamoto, Kanagawa (JP)

(73) Assignee: JOB CORPORATION, Kanagawa (JP)

( * ) Notice: Subject to any disclaimer, the term of this patent is extended or adjusted under 35 U.S.C. 154(b) by 17 days.

(21) Appl. No.: 15/320,364

(22) PCT Filed: Oct. 13, 2015

(86) PCT No.: PCT/JP2015/078876
§ 371 (c)(1),
(2) Date: Dec. 20, 2016

(87) PCT Pub. No.: WO2016/060102
PCT Pub. Date: Apr. 21, 2016

(65) Prior Publication Data
US 2017/0205516 A1    Jul. 20, 2017

(30) Foreign Application Priority Data

Oct. 14, 2014    (JP) .................................. 2014-210016

(51) Int. Cl.
*G01T 1/20*    (2006.01)
(52) U.S. Cl.
CPC .................................. *G01T 1/2018* (2013.01)
(58) Field of Classification Search
None
See application file for complete search history.

(56) References Cited

U.S. PATENT DOCUMENTS

| 7,375,341 B1 | 5/2008 | Nagarkar et al. |
| 7,405,406 B1 | 7/2008 | Nagarkar et al. |
| 7,723,687 B2 | 5/2010 | Nagarkar et al. |
| 2009/0121142 A1 | 5/2009 | Heismann et al. |
| 2012/0126131 A1 | 5/2012 | Ballabriga et al. |
| 2013/0015331 A1 | 1/2013 | Birk et al. |
| 2014/0021354 A1 | 1/2014 | Gagnon et al. |

FOREIGN PATENT DOCUMENTS

| JP | 2000-131440 | 5/2000 |
| JP | 2010-091483 | 4/2010 |

*Primary Examiner* — Edwin Gunberg
(74) *Attorney, Agent, or Firm* — Clark & Brody

(57) ABSTRACT

A photon counting detector is provided for electrometric waves having a wide wavelength range, such as X-rays, gamma rays, and excited weak fluorescence, by use of a common detecting structure. The detector includes an optical connecting part opposed to an emission surface of a columnar-body array and can adjust a spreading range of light emitted from an emission end face of each of a plurality of columnar bodies. The detector also includes a group of APD (avalanche photodiode) clusters opposed to the emission surface via the optical connecting part. In the group of APD clusters, N×N (N is a positive integer of 2 or more) APDs each having a light receiving face are arranged two-dimensionally and the output signals from the N×N APDs are combined by a wired logical addition circuit so as to form an APD cluster serving as one pixel. A plurality of such clusters are arranged two-dimensionally.

18 Claims, 12 Drawing Sheets

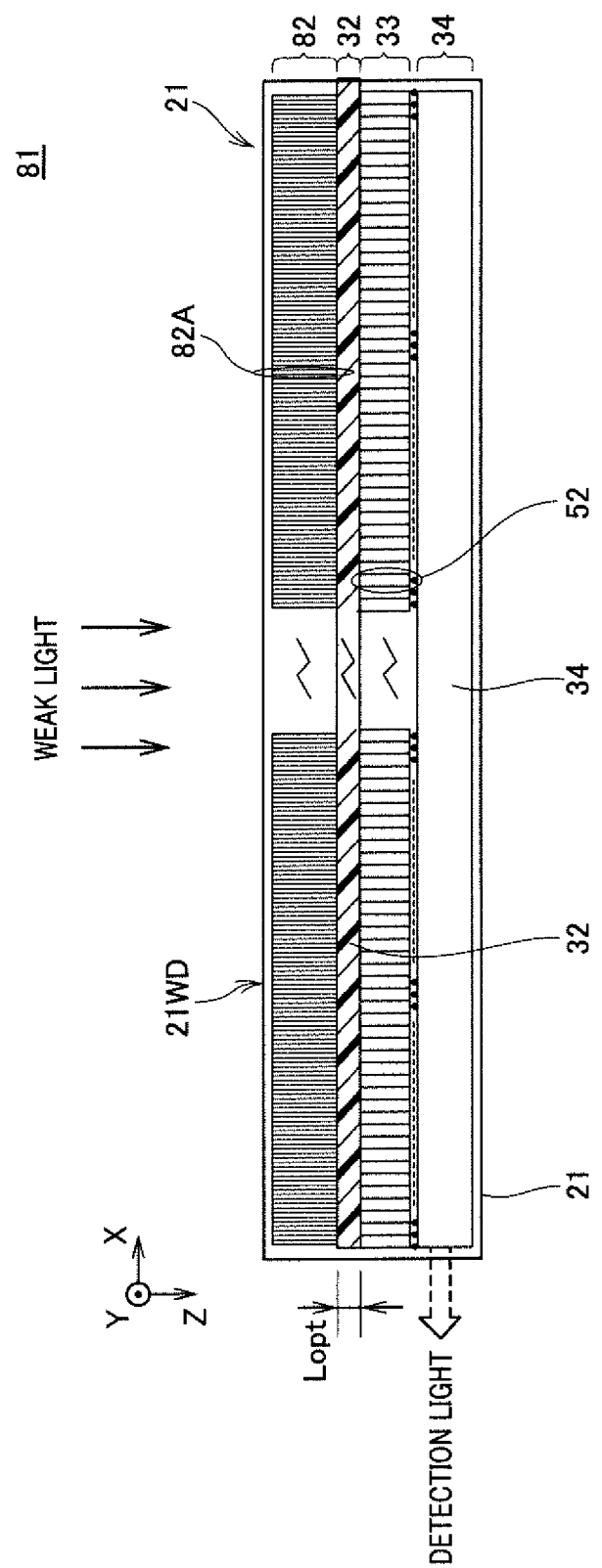

PHOTON COUNTING DETECTOR

CROSS-REFERENCE TO RELATED APPLICATION

This application is based on and claims the benefit of priority from earlier Japanese Patent Application No. 2014-210016 filed on Oct. 14, 2014, the description of which is incorporated herein by reference.

TECHNICAL FIELD

The present invention relates to a photon counting radiation detector which counts the number of photons of radiation or excitation light in every energy range thereof and obtains detection information based on information showing the counted number, and in particular, to a photon counting detector capable of measuring, as the number of photons, the intensity of radiation having a wide range of wavelengths, including radiation such as X-rays or gamma rays or excitation light such as fluorescence.

BACKGROUND ART

In recent years, it has been necessary that, for instance, in the medical field, radiation such as X-rays or gamma rays or excitation light such as fluorescence can be detected fast at every pixel.

As one of conventional detectors having such a function, there is known a gamma camera mounted in nuclear medicine diagnosis apparatuses. This gamma camera receives gamma rays emitted outside from an object body into which nucleus is injected, and outputs, for every emission position, detection information showing the amounts of the gamma rays. Practically the gamma camera is provided with a collimator, a group of scintillators, light guides, and photomultipliers (PMT) when being viewed in the gamma-ray oncoming direction, and on the output side of this photomultiplier, there is provided a position calculating circuit.

The group of scintillators is composed such that a plurality of columnar scintillators are arranged densely and adjacently to each other so that each of such scintillators has a front surface serving as an input surface. The photomultipliers each have a hexagonal input surface and are arranged densely.

Gamma rays incoming through one or more holes of the collimators are thus guided to enter one or more scintillators through the input surface of the scintillators. In such scintillators, scintillation light (pulsed light) is generated by being excited by the incident gamma rays. The scintillation light enters one or more photomultipliers from the output surface of one or more scintillators via light guides. The one or more photomultiplier convert light pulses to electrical signals so as to output electrical pulses, which are proportional to the amount of incoming light, to the position calculating circuit. Based on the one or more output pulses, the position calculating circuit calculates light emitting points, that is, incident positions of the gamma rays. Hence, from the position calculating circuit, information indicative of the emitting positions and the intensities (i.e., energy amounts) can be supplied to an image display and/or memories.

In recent years, while being provided with such a basic scintillation structure, various types of developed scintillators are known as shown in patent references 1 and 2.

CITATION LIST

Patent Literature

[PTL 1] U.S. Pat. No. 7,375,341
[PTL 2] U.S. Pat. No. 7,405,406
[PTL 3] JP-A-2010-091483

However, even if employing the scintillators shown in the above patent references 1 and 2, there have not been realized versatile detectors capable of detecting gamma rays as well as X-rays and faint excitation light in medical diagnostic devices. The reason is that, differently from the gamma rays, the X-rays are required to be detected at higher resolution levels. Additionally, in X-ray detection, the number of photons of the radiation incident onto the detector is overwhelmingly larger (for example, 10,000 times), resulting in that the technical difficulty level of signal processing becomes very high, which is another reason.

The detector has a sensing portion converging X-rays or light to electrical signals, so that the kinds of materials used in the sensing portion and/or how the sensing portion is structured is another important factor for higher detection characteristics. The material and/or structure of this sensing portion is modified depending on various detection purposes, which results in lower volume efficiency and higher parts cost. It is therefore demanded from the market that a detector having a common structure for various diagnostic modalities be developed, which becomes an important factor to lower the production cost. This also useful for generalizing diagnostic modalities, which will lead to suppressing medical expense from being higher.

When considering this view point, the detector is ideal if various diagnostic modalities (including nuclear medicine diagnostic apparatuses, X-ray CT scanners, and fluorescent CT scanners) are provided with a detector having a single common structure capable of detecting a wide range of wavelengths ranging from radiation emitted from an object or transmitted through an object to faint light generated by excitation, which are types of electromagnetic waves.

Meanwhile, recently, developing a photon counting detector is becoming popular (refer to patent reference 3). This detector is configured to count, every pixel, the number of photons of the X-rays and obtain detection information using the counts.

This photon counting detector can detect the X-rays, but is not a detector which enables the foregoing wide range of wavelengths of electromagnetic waves (such as X-rays, gamma rays, and excited faint fluorescent light) to be detected using a single common structure. The reason is that the technical difficulty level is high and far from actual production due to the necessity of employing in common in every electromagnetic wave detector a photon-counting detection structure employed in, at least, gamma ray detection. Practically, the reason is that the conventional photon counting detector is not given means for optimally balancing a plurality of parameters, such as a necessary resolution level, counting rate characteristic, and energy ranges used, in all types of modalities.

The photon counting detector has been developed actively in recent years, but is not able to detect the foregoing wide range of wavelengths of electromagnetic waves in a relatively simple structure.

SUMMARY OF THE INVENTION

It is thus desired to provide a photon counting detector with higher structural versatility which is able to easily adapt electromagnetic waves (such as X-rays, gamma rays, and excited faint fluorescent light) having a wide range of wavelengths to performance criteria required by various modalities using a common structure.

With consideration of the foregoing situations, the photon counting detector (the photon-counting type of detector) is provided as a detector to detect radiation or weak light (weak-intensity light) generated by excitation.

As an exemplary embodiment, the detector is characterized in that the detector includes a columnar-body array provided with a plurality of columnar bodies mutually densely and adjacently arranged, each of the columnar bodies receiving incident radiation or light, the incident radiation being converted to light or the incident light being transmitted in one direction therealong, each of the columnar bodies having an emission end surface through which the converted light or the transmitted light is emitted outside, the emission end surfaces of the columnar bodies forming an emission surface;

an optical connector formed to be opposed to the emission surface of the columnar-body array, the optical connector being able to adjust a range of spread of the light emitted from the emission end surface of each of the columnar-body members;

a group of avalanche photodiode (APD) clusters arranged to be opposed to the emission surface via the optical connector and formed by a plurality of APD clusters arranged two-dimensionally, each of the APD clusters serving as one pixel and being formed by N×N pieces (N is a positive integer of 2 or more) of APDs having a light receiving face, the N×N pieces of avalanche diodes being arranged two-dimensionally and providing output signals electrically combined by a wired OR circuit;

a processing circuit processing an electrically combined output signal produced by the wired OR circuit of each of the plurality of APD clusters.

The optical connector is configured such that the range of spread of the light emitted from the emission end face of each of the columnar bodies is spread over, at least, the light receiving faces of the N×N pieces of APDs configuring the individual APDs.

The processing circuit includes a plurality of measurement circuits, each of the measurement circuits being arranged for each of the APD clusters, each of the measurement circuits being able to measure, as the number of photons of the light, energy of the emitted light in each of a plurality of divided energy ranges for a predetermined period of time, based on the output signal provided from each of the plurality of APD clusters;

an addition circuit adding, so as to produce a sum, counts counted by a plurality of measurement circuits designated among the measurement circuits, the sum of the counts being regarded as the scintillation light generated by a substantial single pulse of the radiation, a single APD cluster being designated as a scintillation center APD cluster and being one of the APD clusters connected to one of the measurement circuits which has firstly counted up a given number of electrical pulses, the plurality of the designated measurement circuits being connected to a given number of APD clusters designated among the APD clusters, the given number of APD clusters being located around the scintillation center APD;

inhibition commanding means commanding the given number of APD clusters located around the single APD cluster, to inhibit counting the photons entering the given number of APD clusters located around the single APD cluster, for a predetermined period of time during which the signal measurement circuit connected to the single APD cluster is counting;

inhibition means arranged in each of the plurality of measurement circuits, the inhibition means inhibiting counting of the measurement circuits when the inhibition commanding means issue a command for inhibiting the counting;

positional information calculating means calculating positional information of the scintillation based on the scintillation center APD cluster; and an output circuit outputting positional information indicative of the scintillation center APD cluster and information indicative of the number of photons of the radiation, at least, in each of the energy ranges.

In the photon counting detector, there is provided an optical connector formed to be opposed to the emission surface of the columnar-body array and capable of adjusting a light spread range of light emitted from the emission end face of each of the plurality of columnar bodies. In addition, there are also provided a group of APD clusters in which a plurality of APD clusters is two-dimensionally arrayed. Each APD cluster corresponds to a single pixel. The group of APD clusters are arranged to be opposed to the emission surface via the optical connector. In the APD cluster group, "N×N (N is a positive integer of 2 or more)" avalanche photo diodes (APD) each having a light receiving face are two-dimensionally arrayed and the output signals of the "N×N" APDs are combined by a wired logical addition circuit. Hence, depending on the number of photons (i.e., an amount of light) of a pulsed light emitted from the respective columnar bodies of the columnar-body array, the spread range of the light (i.e., the spread of light with a solid angle) propagated in the optical connector can be adjusted. Accordingly, higher accuracy measurement with a desired resolution level and with fewer countless events of the number of photons can be provided by appropriately setting both the spread range of pulses of light propagated in the optical connector and light-reception ranges assigned to the respective APD clusters which receive the light pulses. In other words, when an object being measured is given as radiation or weak light (i.e., propagating medium), this setting enables the detector to detect the radiation or the weak light using the common detecting structure for both applications.

BRIEF DESCRIPTION OF THE DRAWINGS

In the accompanying drawings:

FIG. 12 is a sectional view outlining a modification of the detector according to the present invention, which is composed of compositions used except for a fiber optic plate (FOP).

DETAILED DESCRIPTION OF THE INVENTION

With reference to the accompanying drawings, a photon counting detector (photon counting type of detector) according to the present invention will now be described.

[First Embodiment]

First, with reference to FIGS. 1 to 11, a first embodiment of the photon counting radiation detector will now be described.

Figure 1:
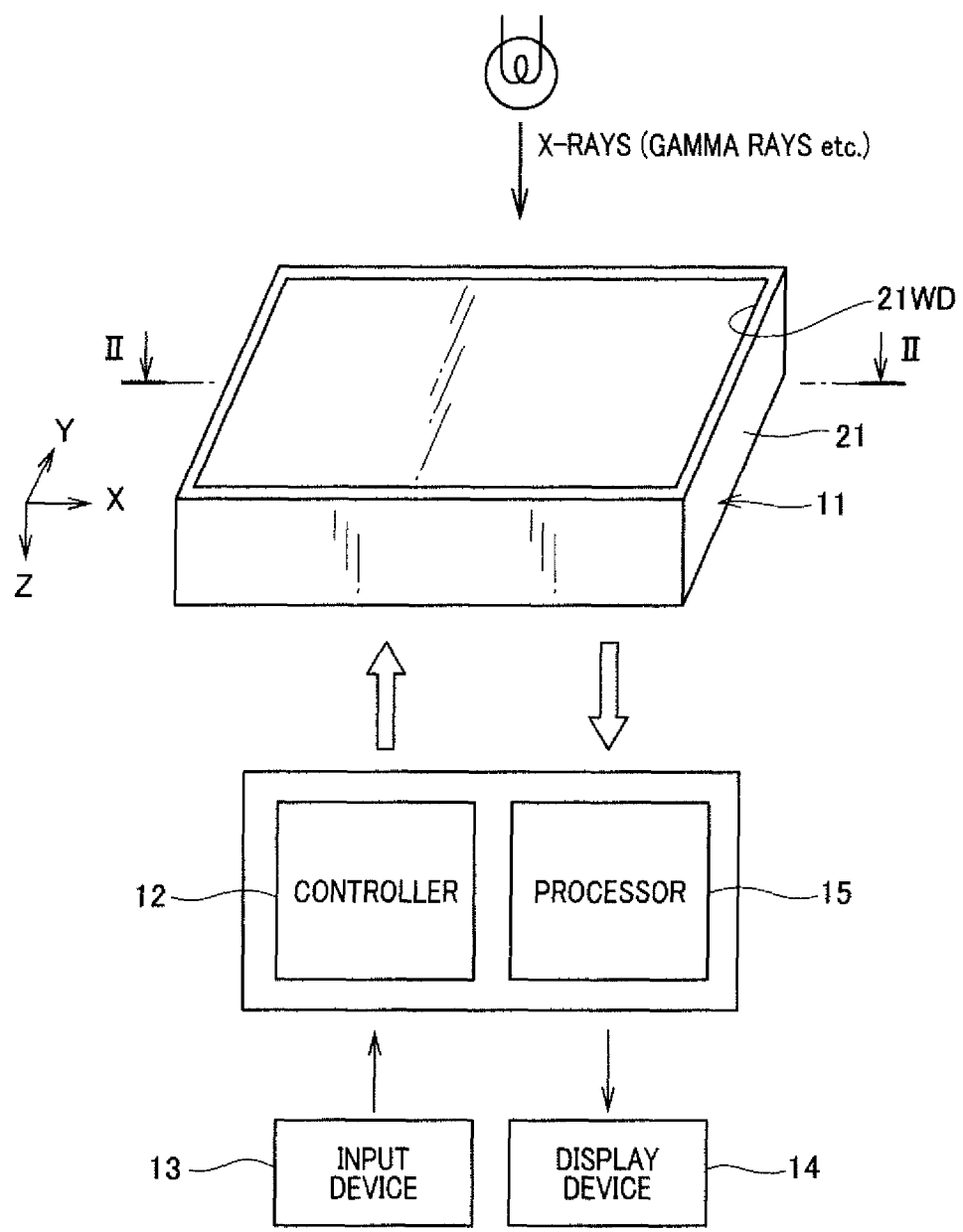
FIG. 1 is an oblique perspective view outlining a detection system in which an X-ray detector (provided as one mode of the radiation detector) according to a photon counting detector of the present invention.

FIG. 1 outlines the configuration of a detection system in which a photon counting radiation detector detects radiation emitted from a radiation source. The radiation source is for example an X-ray tube mounted in medical X-ray diagnostic apparatuses or nuclide administered into an object in nuclear medicine diagnostic apparatuses. In the X-ray diagnostic apparatuses, X-rays (X-ray beams) radiated from the X-ray tube are transmitted through an object being examined. In the nuclear diagnosis, gamma rays serve as a medium being detected, the gamma rays being emitted from a nuclide administered in an object being examined. In the current embodiment, the radiation is referred to as ionized radiation which includes weak-intensity light such as fluorescence excited by excitation light, that is, weak light, so that the radiation is one of propagative mediums belonging to the range of electromagnetic waves in a broader sense.

FIG. 1 shows a detection system, in which a photon counting radiation detector is an X-ray detector. This photon counting X-ray detector 11 (hereinafter, simply referred as a detector) is able to process the incident X-rays as streams of photons and is configured to detect the number of photons for every energy range and output the counts as detection information. The detector 11 is operable under control of a controller 12 which controls the operations thereof. The controller 12 is communicably connected to an input device 13 and a display device 14, which are used for interactive or non-interactive communication of operated information and/or input and output information with an operator. Though not shown in particular, the controller 12 include a drive circuit for driving the detector 11.

Moreover, on the output side of the detector 11, there is provided a processor 15 configured to process the detection information, such as reconstructing images based on the detection information for instance.

As shown in FIG. 1, the detector 11 is housed in an approximately box-shaped case 21. This case 21 is made from an X-ray non-transmitting material except for the upper surface shown in FIG. 1, and components necessary for the detection are housed in the case 21 as detailed later.

The surface 21WD of the case 21 (refer to FIG. 1) is formed of a member having lower X-ray absorption rate (for example, carbon resin) and serves as an X-ray incidence window. Such a member is selected for the purpose of securing deliquescency of a scintillator described later (when the scintillator has deliquescency), light shielding, and efficiently guiding light to a light receiving face by light reflection. The detector 11 is therefore positioned so as to make its X-ray incidence window 21WD face the X-ray coming direction. By way of example, in a case where the detector 11 is mounted in a dental panoramic X-ray imaging apparatus, the X-ray incidence window 21WD is always directed toward the X-ray tube such that the detector and the X-ray tube are positionally controlled to provide paired components rotating about the head of a patient.

For the sake of a simplified explanation of the box-shaped detector 11, a three-dimensional orthogonal coordinate having X-, Y- and Z-axes is set as shown in FIG. 1, in which the X- and Y-axes are assigned to the edges of the X-ray incidence window 21WD. According to these coordinate axes, a section along a lateral direction of the detector 11, that is, the X-axis (i.e., a section taken along a II-II line in FIG. 1) can be shown in FIG. 2.

In the shape of this section, along the longitudinal direction of the X-ray incidence window 21WD, that is, the Z-axis, there are arranged a scintillator layer 31 functioning as a columnar array, an optical connecting layer 32 serving as an optical connecting member, a photoelectric conversion layer 33, and a processing circuit layer 34 serving as a processing circuit in this order from the window.

By this configuration, when the X-rays (pulsed X-ray beams) reach the X-ray incidence window 21WD of the detector 11, the X-rays pass through the incidence window 21WD and come to an incidence surface (detailed later) of the scintillator layer 31 positioned below the window. In the scintillation layer 31, the incident pulsed X-rays are received by one or more scintillators (detailed later) functioning columnar bodies, whereby the scintillators scintillate light. This scintillated light is emitted, as pulsed spread light (i.e., light two-dimensionally spread with an emission angle), from the emission surface (detailed later) of the scintillators to the optical connecting layer 32. As explained in the following, in the present embodiment, the optical connecting layer 32 is formed as a resin layer having a predetermined thickness in the Z-axis direction. For this, as detailed later, the optical connecting layer 32 is formed such that a single spread light pulse enters a plurality of pixel areas of the photoelectric conversion layer 33. The corresponding pixels of the photoelectric conversion layer 33 respectively convert the incident pulsed light to an electrical pulse. This electrical pulses are processed in the processing circuit layer 34, resulting in output of electrical signals, i.e., detection signal, from the circuit layer 34 depending the incident X-rays.

In this way, the detector 11 has the function of converting the incident X-rays to electrical signals via the scintillation light, and, moreover, the doctor 11 has, in addition to the foregoing configurations, a configuration to secure versatility to objects being detected, which is inherent to the present application. Hereinafter this configuration will be explained more practically. The layers 31 to 34 will be explained in this order.

<Scintillation Layer>

Figure 2:
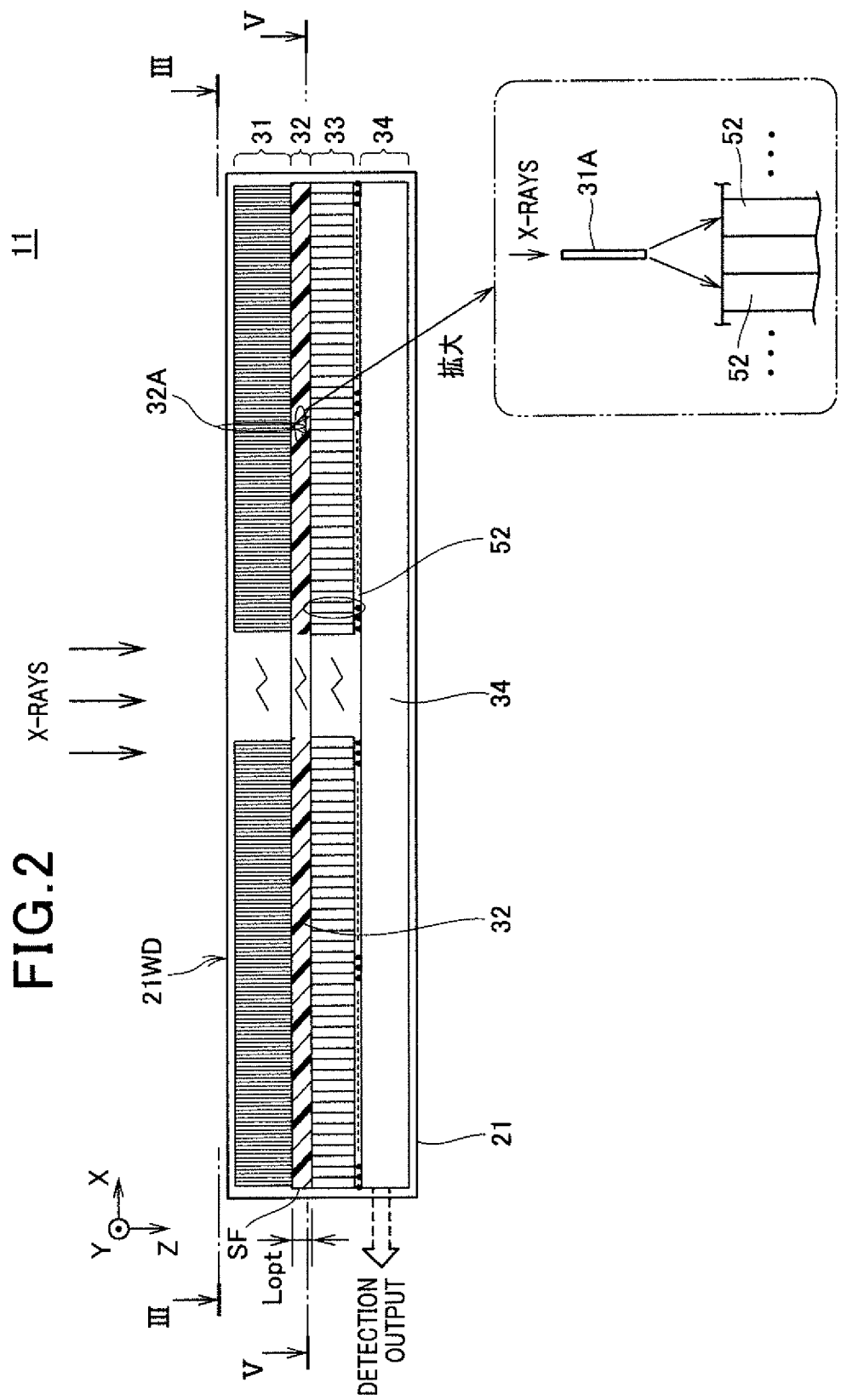
FIG. 2 is a sectional view outlining the X-ray detector.
Figure 3:
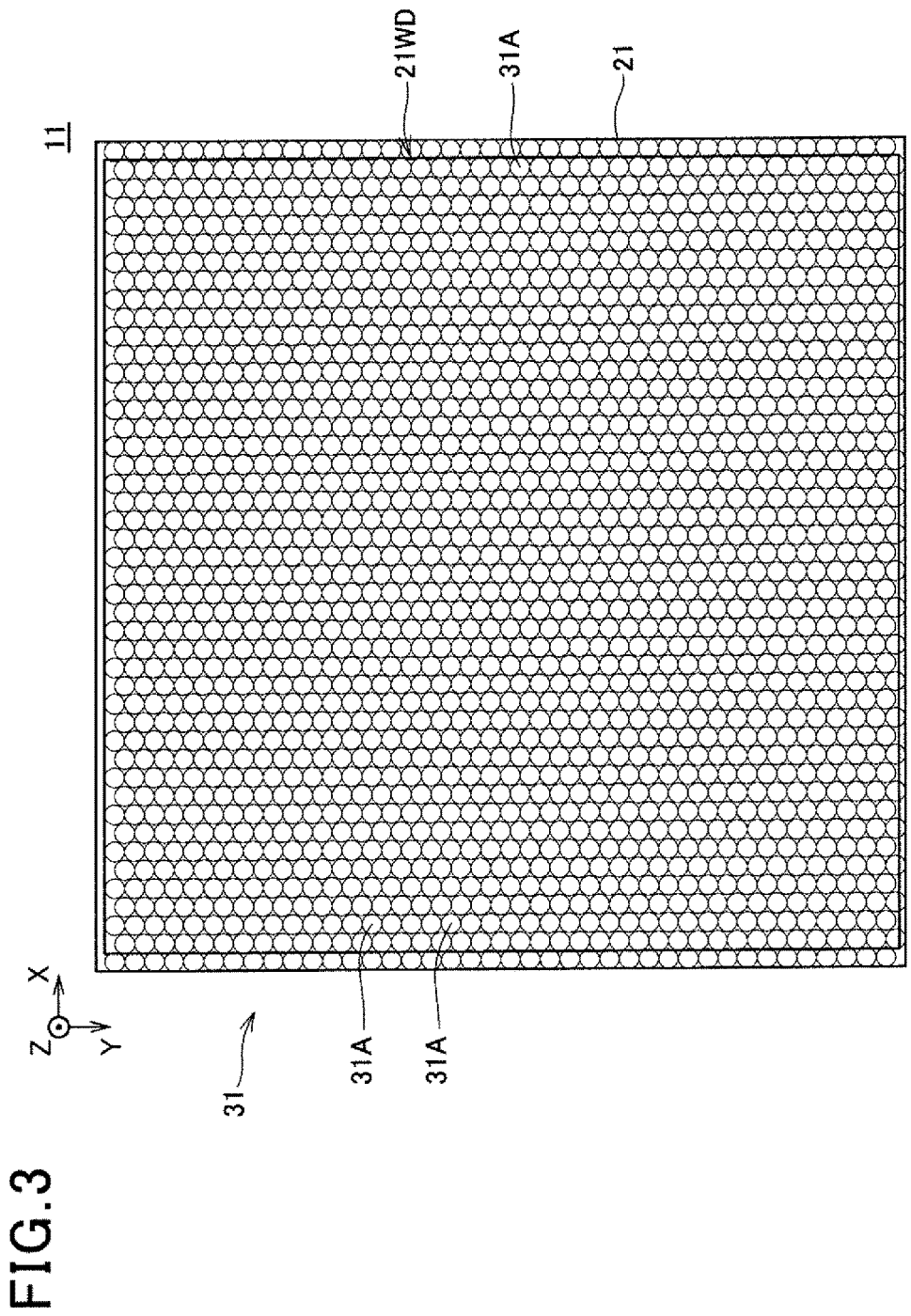
FIG. 3 is a plan view showing a plane taken along a line shown in FIG. 2.

The scintillation layer 31 is an array of a plurality of columnar bodies 31A arranged densely and adjacently to each other in a two-dimensional plane, i.e., an XY plane, as shown in FIGS. 2 and 3. The columnar bodies 31A, which function as columnar bodies, are cylindrical scintillators (Micro-columnar scintillator: minimal columnar scintillating body) with a fine radius and a predetermined length. Practically, the bodies are arranged densely in the XY plane so as to make the length directions of such columnar bodies align in the longitudinal direction, i.e., a Z-axis direction. The scintillators 31A each size a diameter of 20 μm and a length of 1.5 mm, for instance. Concerning the diameter, a given range of irregularities in the size is allowable, so that it is not always exactly 20 μm, thereby being an amount of approximate 20 μm with a given allowable band. The length of the scintillators can be changed depending on applications. For example, when detecting gamma rays, the length is allowed to be made larger than 1.5 mm, that is, the scintillation layer 31 becomes thicker.

The scintillators 31A are made of, by way of example, Ce:LaCl3 which is an X-ray/light conversion material. The X-ray characteristics of Ce: LaCl3 can be outlined such that the number of photons emitted is 60000/1MeV, density is 5.2 g/cm$^3$, energy resolution is 3%(@662 KeV), delay time is 18 nsec, and the band of wavelengths is 380 to 420 nm. This material has various advantages including higher characteristics than NaI which is a scintillator material used in general gamma cameras, in terms of energy resolution, detection sensitivity, reaction speed, afterglow characteristics, and other characteristics. Such advantages further include no deliquescence and growing to columnar bodies with eutectic composition. It is also easier to adopt such scintillators to detecting gamma-rays.

Figure 4:
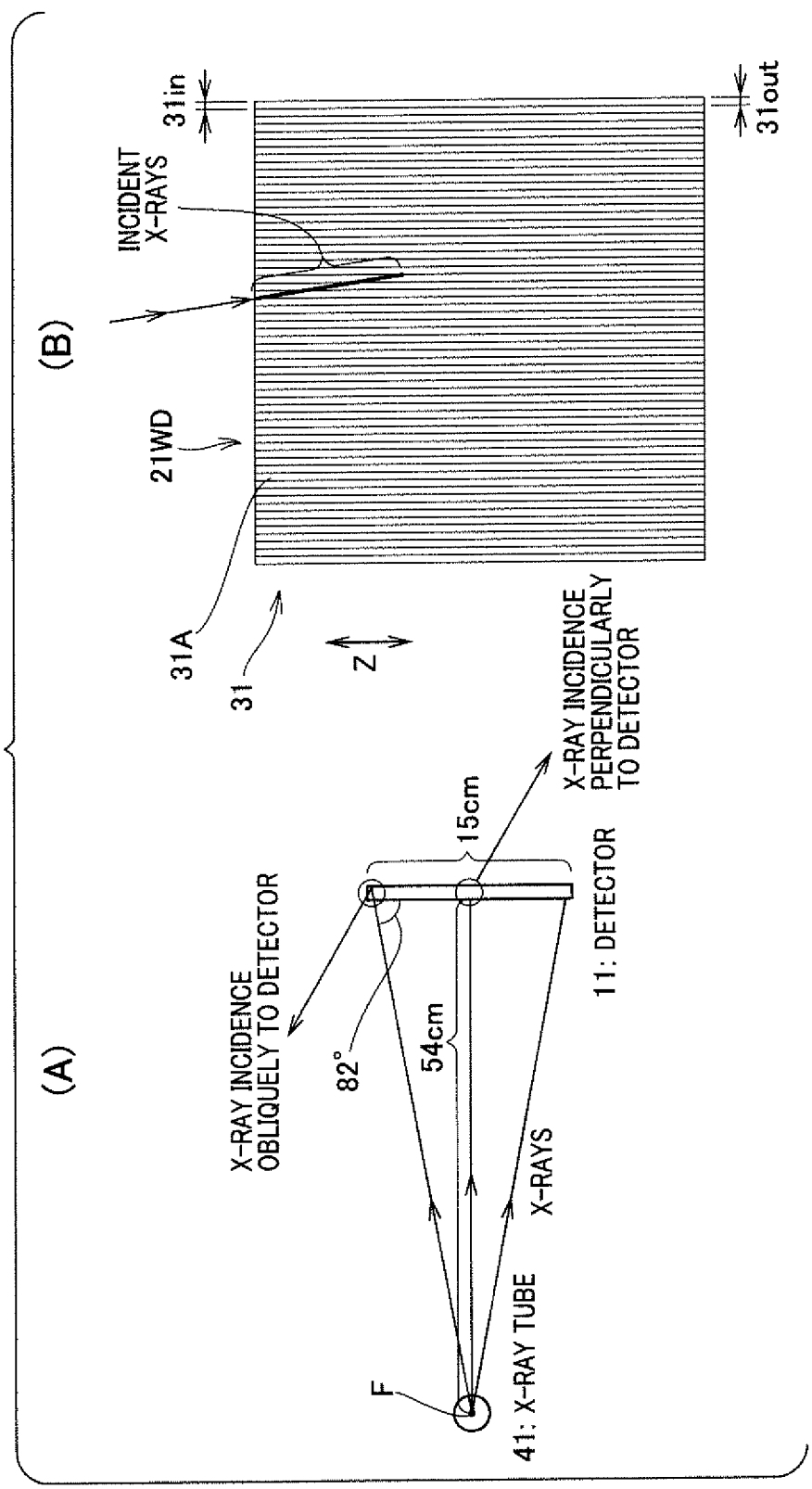
FIG. 4 provides illustrations, in (A) and (B) thereof, showing a spread of an X-ray beam emitted from an X-ray tube and an oblique incidence into a scintillation layer.

Therefore, when an X-ray beam enters one of two end faces of each of the scintillators 31A, that is, the face $31_{in}$ (incidence end face: refer to FIG. 4($b$)), the light (scintillation light) is generated by excitation of incident light at a length-directional position in the scintillator 31A. The generated scintillation light is kept within the columnar body, but is propagated toward the other face $31_{out}$ (emission end face) of the columnar body in the length direction and emitted outside from the emission end face, spreading in the emission angle. In the present embodiment, the term "outside" means "to the optical connecting layer 32."

The X-ray beam does not necessarily enters perpendicularly to the incidence end face 31in of each of the scintillators 31A, but may enter obliquely thereto. As shown in FIG. 4($a$), this is because the X-ray beam is emitted from the X-ray focal point F of the X-ray tube 41 positionally opposed to the detector 11, with a given spread of angles (i.e., a fan angle). In a geometry shown in FIG. 4($a$), an angle made between the X-ray axis direction of the detector 11 and the edge of a fan-shaped X-ray beam is approximately 82 degrees. In this geometry, as shown in FIG. 4($b$), when assuming that an X-ray portion B passing along an edge of the beam and having an X-ray photon excited by 100 keV comes into a scintillator 31A' obliquely, the X-ray portion provides an oblique track of about 500 μm and a spread of about 69 μm. This oblique incidence still makes it possible that one or more scintillators 31A through which the track passes generate scintillation light therein, as probability events.

<Optical Connecting Layer>

The optical connecting layer 32 will now be described. This optical connecting layer 32 is configured to function as an interface layer connecting the emission end face (i.e., the face composed of the other faces $31_{out}$ of the respective scintillators 31A) of the front-side scintillation layer 31 and the rear-side photoelectric conversion layer 33. This optical connecting layer 32 is formed by processing optically-transparent resin material into a plate-shaped member having a thickness Lopt in the longitudinal direction, i.e., the Z-axis direction, which is suitably selected fitted to applications of the detector 11. As the resin material which can be used, silicon-related resin is preferred which is optically transparent and allows the refraction index thereof to be adjusted to some amount for adjusting the spread angle of the emitted light.

The optical connecting layer 32 which has a wall 32W enclosing the layer 32 from outside the periphery in the longitudinal direction is made of a member which has, for example, a white refection surface which is for total reflection of the scintillation light. This wall 32W can be made by coating an optical refractive agent to the wall for total refraction.

The thickness Lopt of this optical connecting layer 32 is a significant factor and, for example, is set within a range of a few dozen of micrometers to a few hundred of micrometers, with consideration of a balance among various factors such as a desired resolution level and desired counting characteristics.

As a modification, the optical connecting layer 32 can be formed as an air layer.

<Photoelectric Conversion Layer>

The photoelectric conversion layer 33 is a layered part composed of elements which receive the emitted light from the respective scintillators 31A and generates electrical pulses responsively to the received light.

Figure 5:
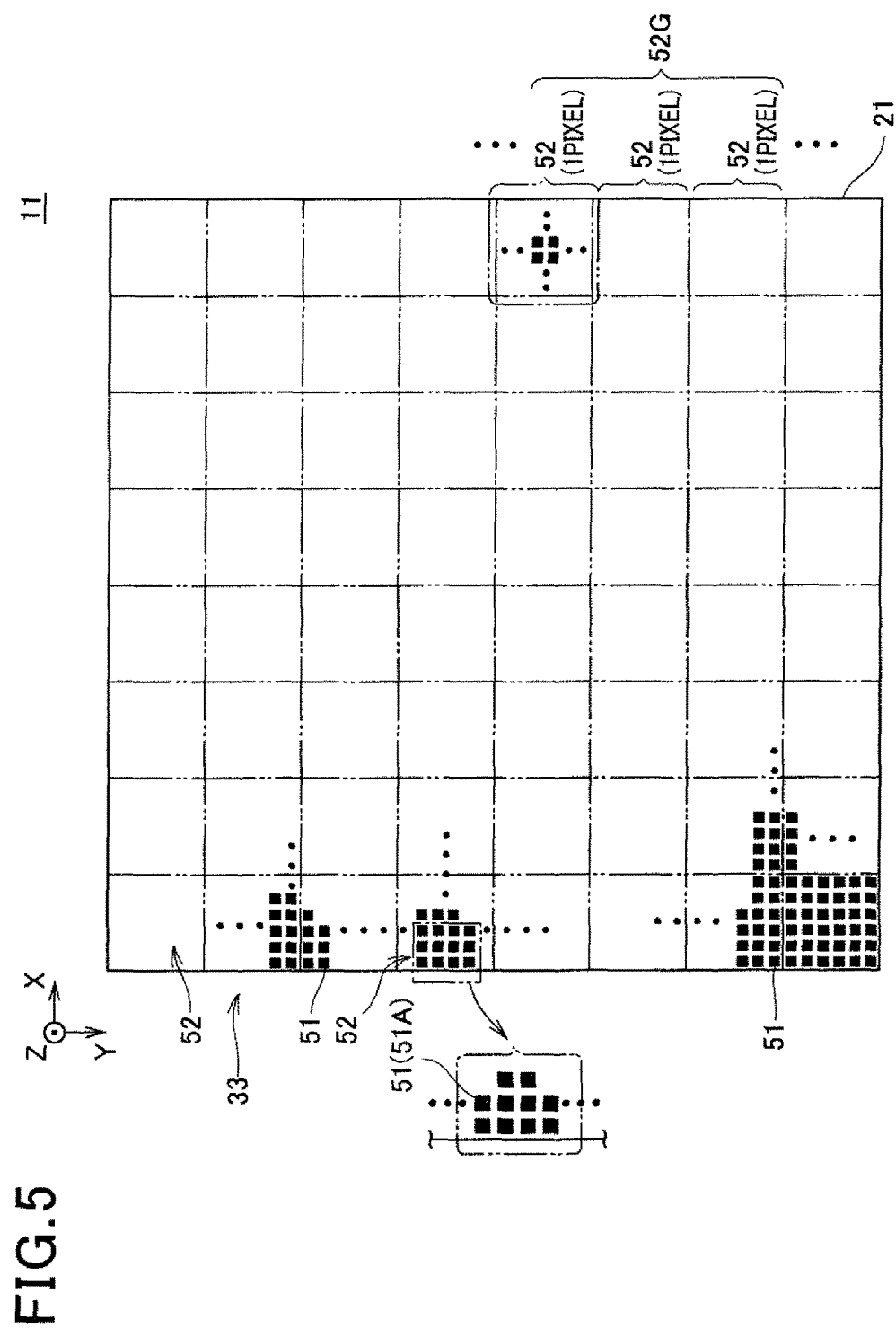
FIG. 5 is a plan view showing a plane taken along a V-V line in FIG. 2.

Specifically, as shown in FIG. 5, this photoelectric conversion layer 33 is composed of a plurality of avalanche photodiodes (APD) 51 arranged mutually densely and adjacently, and two-dimensionally in the XY plane, in the similar manner to the scintillation layer 31. The APDs 51 each are formed into a square columnar shape of, for example, horizontal and vertical sizes of 10 μm×10 μm, and the APDs are arranged two-dimensionally with electric insulation layers inserted therebetween and mutually adjacently, so that the layer is densely covered with the APDs. The square columnar shaped ADPs 51 have a surface exposed to the optical connecting layer 32, and light receiving sections 51A for the scintillation light are formed on the surface.

Among these plural APDs 51, a given number of APDs which are composed of given numbers of pieces in both the X- and Y-axes, for example, 10 pieces×10 pieces (=100 pieces), are electrically connected to each other via a wired logical addition circuit (refer to FIG. 8 later described) in the processing circuit layer 34 or at one end of each of the APDs, the one ends being electrically connected to the processing circuit layer. Hence, a given number of APDs among the APDs 51A (for example, 100 pieces which provide a rectangular region (for example 150 μm×150 μm), where the size of gaps among the APDs are considered when being manufactured)) constitute an APD cluster 52.

In the detector 11 of the present embodiment, as shown in FIGS. 1 and 5, the connections using the wired logical addition circuits provide an equivalent arrangement where a plural of the APD clusters 52 are arranged in both the X-axis and Y-axis directions in a mutually adjacent manner. Each of the APD clusters 52 serves as one pixel. In this way, the photoelectric conversion layer 33 is configured by a group of APD clusters composed of the two-dimensionally arranged plural APDs 52.

The group 52G of the APD clusters 52, namely, the photoelectric conversion layer 33 can be related to the size and shape of the scintillation layer 31, and such a relation can be summarized below. The APD cluster group 52G is arranged to be opposed to the emission end faces $31_{out}$ of the scintillators 31A via the optical connecting layer 32. In this formation, the N×N square columnar APDs 51 (N is a positive integer of 2 or more) are arranged, where each APD has the light receiving section 51A and the square having one side which is smaller than the radius of a section of each scintillator 31A perpendicular to the axial direction thereof. By combining the output signals from the "N×N"-piece APDs with others by the wired logical addition circuit, one APD cluster 52 is formed. Physically, the region occupied by the APD cluster 52 in the XY plane corresponds to one pixel. Incidentally, the present embodiment provides a calculation scheme as will be described later, where comparison calculation is performed so as to divide each physical pixel into a pixel of "one severalth" size (in the present embodiment, 1/4), whereby finer sub-pixels are produced. By this calculation, information indicative of X-ray incidence positions can be obtained every sub-pixel.

As a result, it is understood that the two-dimensionally arranged plural APD clusters 52 provide a structure equivalent to an array in which a plurality of physical pixels are arranged two-dimensionally across the X-ray incidence window 21WD.

Figure 6:
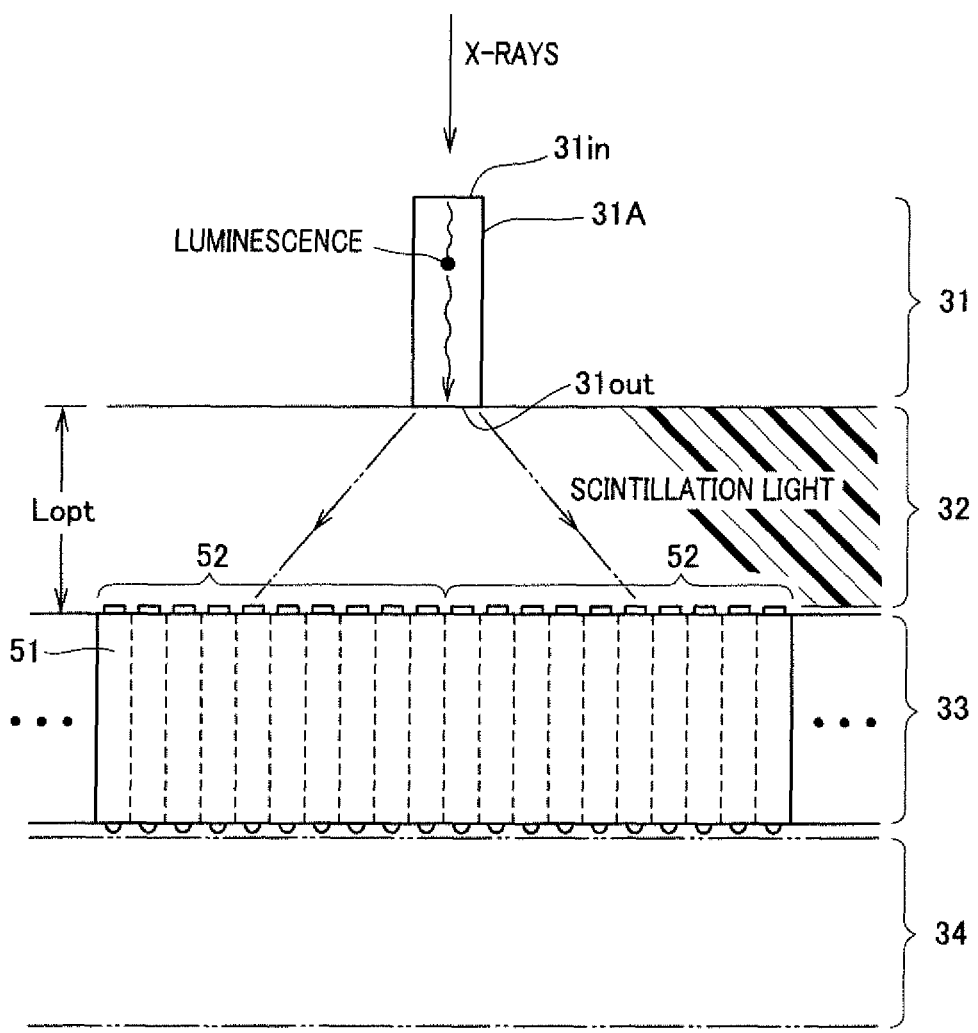
FIG. 6 is an illustration showing both a scintillation light beam spread from one scintillator to an optical connecting layer and, in one direction, a plurality of APD clusters receiving the scintillation light.

FIG. 6 pictorially shows an event in which an X-ray beam enters the incidence end face 31in of a scintillator 31A present in the scintillation layer 31. When received by the columnar scintillator 31A, the X-ray energy is absorbed by the fluorescent body composing the scintillator 31A, which causes excitation or ionization in atomic nuclei inside the fluorescent body, which thus generates a pulsed light using a part of the absorbed energy. This light is called scintillation light. The scintillation light is then transmitted inside the scintillator 31A and is emitted from the emission end face 31out with a solid-angle spread, towards the optical connecting layer 32. In the present embodiment, the thickness Lopt of the optical connecting layer 32 in the Z-axis direction is optimized such that the spread light has a projection range which spreads over an area larger than the area of the one pixel, that is, the one APD cluster 52.

Figure 7:
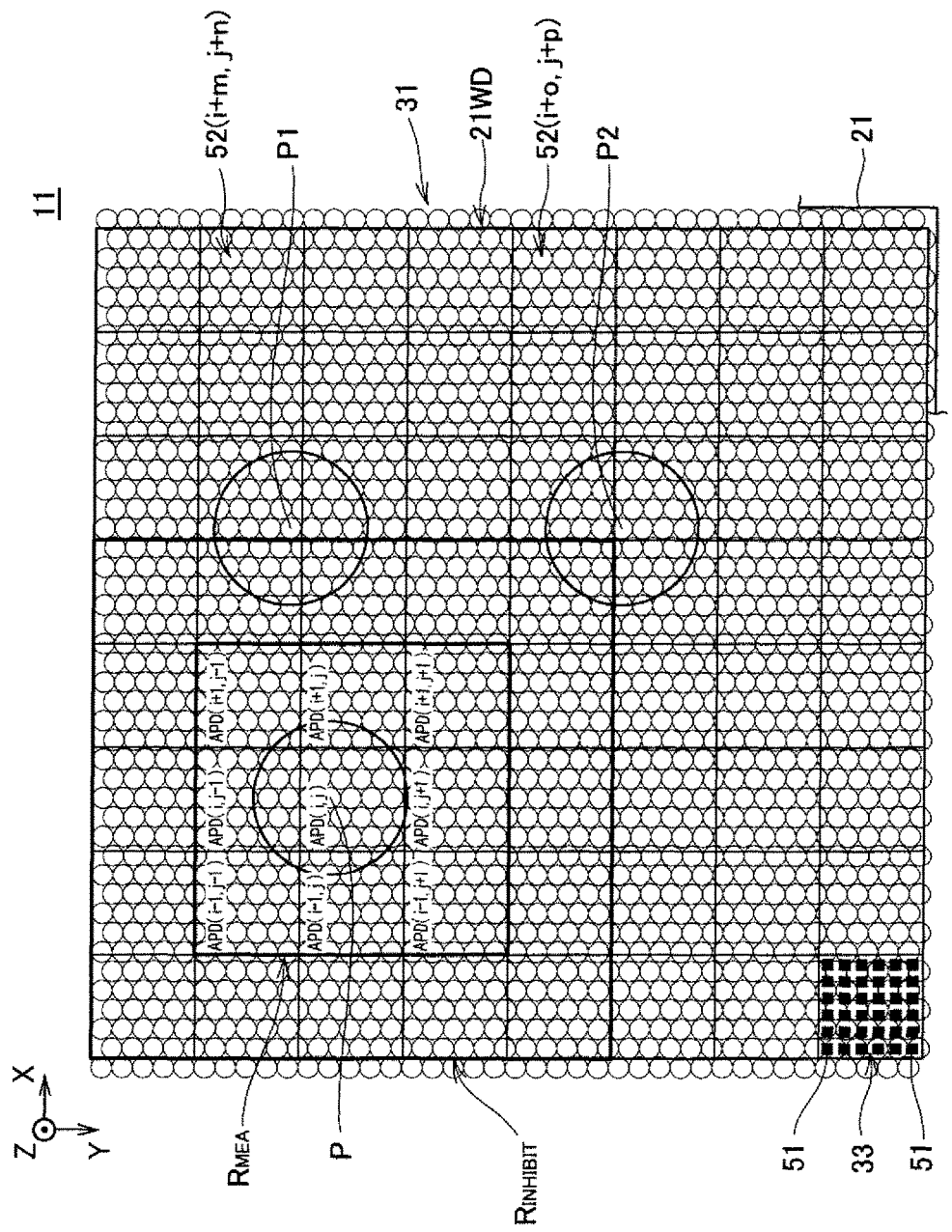
FIG. 7 is an illustration pictorially showing how the detector is layered when the surface (the X-ray incidence window) of the X-ray detector is viewed from a view point located in the X ray beam entering the plane.

A reception process for the emitted scintillation light will now be described. FIG. 7 is an illustration pictorially showing a geometrically overlapped relationship among the scintillation layer 31, the photoelectric conversion layer 33, and the photoelectric conversion layer 33. This illustration shows a two-dimensional perspective view pictorially drawn, which is obtained when seeing the X-ray incidence window 21WD in the X-ray incidence direction, that is, from the right above in the Z-axis direction. As shown, the two-dimensional arrangement of the plurality of scintillators 31A, the two-dimensional arrangement of the plurality of APDs 51, and the plurality of APD clusters (each composing one pixel) are formed by electrically combining a given number of the plurality of APDs 51 located within each block enclosed in the plane. In the present embodiment, the optical connecting layer 32 is a layer made of resin material.

Figure 8:
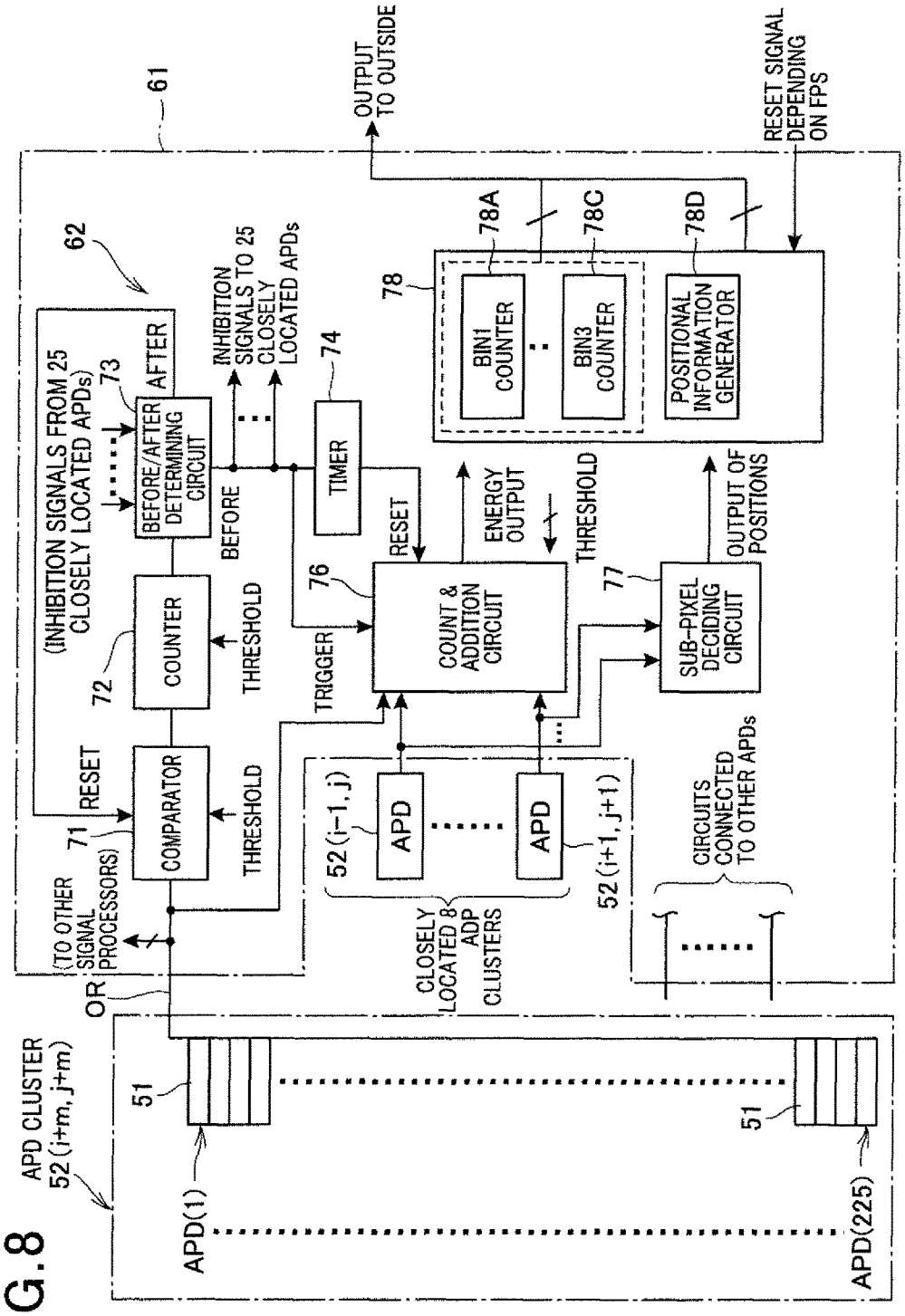
FIG. 8 is a block diagram showing circuitry centering on a processing circuit section per physical pixel, which is fabricated in a processing circuit layer.

With reference to FIG. 8, a signal processing circuit 61 will now be exemplified which is formed in the processing circuit layer 34 at each physical pixel, i.e., at each APD cluster 52. This signal processing circuit 61 is provided, every pixel, in the processing circuit layer 34 using an ASIC. The signal processing circuit 61 provided in FIG. 8 shows one of the APD clusters 52, that is, circuitry electrically connected to a single physical pixel.

As shown in FIG. 8, all the APDs of each APD cluster 52 (in this example, 225 (15×15) pieces of APDs from APD (1)-APD(225)) are electrically connected to an individual signal circuit section 62 via a wired logical addition circuit OR.

This signal circuit section 62 includes a comparator 71 electrically connected to the wired logical addition circuit OR, and a counter 72, a before/after determining circuit 72, and a timer which are arranged on the output side of the comparator 71. Additionally this signal circuit section 62 includes a group of circuits for identifying an X-ray incidence pixel in the X-ray incidence window 21WD and counting the X-ray energy as the number of X-ray photons in each energy range.

The group of circuits includes a count & addition circuit 76, a sub-pixel deciding circuit 77, and an output circuit 78. Of these circuits, the count & addition circuit 76 is connected to the output terminals (i.e., not-shown wired logical addition circuits) of eight of the ADP clusters 52, in which the eight APD clusters 52 are closely (densely) located with each other and connected to the wired logical addition circuits OR, in the same way as that shown in FIG. 8. The sub-pixel deciding circuit 77 actually includes a counter and a comparator and is connected to the output terminals of the closely (densely) located eight APD clusters 52.

For instance, when drawing attention to an APD cluster 52(i, j) in the example shown in FIG. 7, the closely located eight APD clusters 52 are represented by eight APD clusters 52(i−1, j−1), 52(i, j−1), 52(i+1, j−1), 52(i−1, j), 52(i+1, j), 52(i−1, j+1), 52(i, j+1), and 52(i+1, j+1), which positionally enclose the APD cluster 52(i, j). These nine APD clusters provide temporarily a measurement target region RMEA responsive to an X-ray photon incidence at a certain position in the X-ray incidence window 21WD at a certain time instant.

In addition, sub-pixels virtually decided by the sub-pixel deciding circuit 77 are represented by four rectangular (square) sub-pixels APD(i, j)−1, APD(i,)−2, APD(i, j)−3, and APD(i, j)−4 which are produced by virtually dividing the APD cluster 52(i,j) now targeted.

The foregoing circuitry will now be explained in detail, first of all, starting with the comparator 71 electrically connected to the wired logical addition circuit OR. To this comparator 71, a predetermined value which is set to the wave height (intensity) of a pulse signal is supplied as a threshold. This threshold is set as a value which is able to discriminate a counting signal from noise signals. Hence, the comparator 71 compares, with the predetermined threshold (i.e., the wave height value), a pulse signal which is composed of a single electrical pulse or a combination of electrical pulses from the one or more APDs 51, which is inputted via the wired logical addition circuit OR. With this comparison, when the wave height value of the input signal is larger than the threshold, a binary signal "1" is outputted to the next-stage counter 72. The counter 72 is also given a threshold for counting. This threshold for counting is a discriminative value used in deciding a real X-ray incidence position. Using this threshold, the counter 72 is able to output a command signal for measurement start to the next before/after determining circuit 73 only when the count of the counter 72 becomes a predetermined value of "5 counts", for instance.

The term "before/after" of the before/after determining circuit 73 means temporal before and after. When receiving the measurement start signal from the counter 72, the before/after determining circuit 73 outputs, to a not-shown signal circuit section connected to the individual APDs, an inhibition signal which inhibits a predetermined number of neighborhood APD clusters; in this embodiment, 25 APD clusters 52, from receiving an addition request, where the 25 APD clusters 52 compose an inhibited region $R_{INHIBIT}$. This inhibited region $R_{INHIBIT}$ for the addition is exemplified in FIG. 7, and as shown, by way of example, 25 pieces of the APD clusters 52 at the center of which a targeted APD cluster 52 (i, j) is located. In response to the reception of this inhibition signal, the signal circuit section of each of the 25 APD clusters 52 inhibits, for a preset period of time measured by the timer 74, addition of electrical pulses generated by X-ray incidences caused immediately after an X-ray incidence currently targeted.

The inhibition signal is also provided, as a triggering signal, to the count & addition circuit 76. In response to the reception of the inhibition signal, the timer 74 starts counting the preset period of time. When counting up this preset period, the timer 74 provides a reset signal to the count & addition circuit 76.

In reply to the reception of the triggering signal, the count & addition circuit 76 is able to recognize that the targeted APD cluster 52 (i, j) positionally including a current X-ray incidence position (for example, shown in FIG. 7 by a scintillating position P) (namely, a scintillation-center APD cluster) should be handled by the count & addition circuit 76 itself. Accordingly, this count & addition circuit 76 counts, every energy range (band), the number of electrical pulse signals outputted from each of eight APD clusters 52 consisting of APD clusters 52(i−1, j−1), 52(i, j−1), 52(i+1, j−1), 52(i−1, j), 52(i+1, j), 52(i−1, j+1), 52(i, j+1), and 52(i+1, j+1), which form a measurement target region $R_{MEA}$ whose center is the targeted APD cluster 52(i, j), and which are located to surround the targeted APD cluster 52(i, j). The count & addition circuit 76 adds the counts to each other, every energy range. This counting measurement for each of the X-ray energy ranges can be performed by a circuity similar to the conventionally known photon counting circuits. The electrical pulse signals are generated in response to X-ray photon incidence events in the scintillator 31A. It is thus understood that the foregoing individual measurement of the number of electrical pulse signals and the addition of the number of counts obtained from the measurement target region $R_{MEA}$ (specifically, composed by the foregoing nine APD clusters 52) is exactly equivalent to counting the photons over the entire measurement target region $R_{MEA}$.

Figure 10:
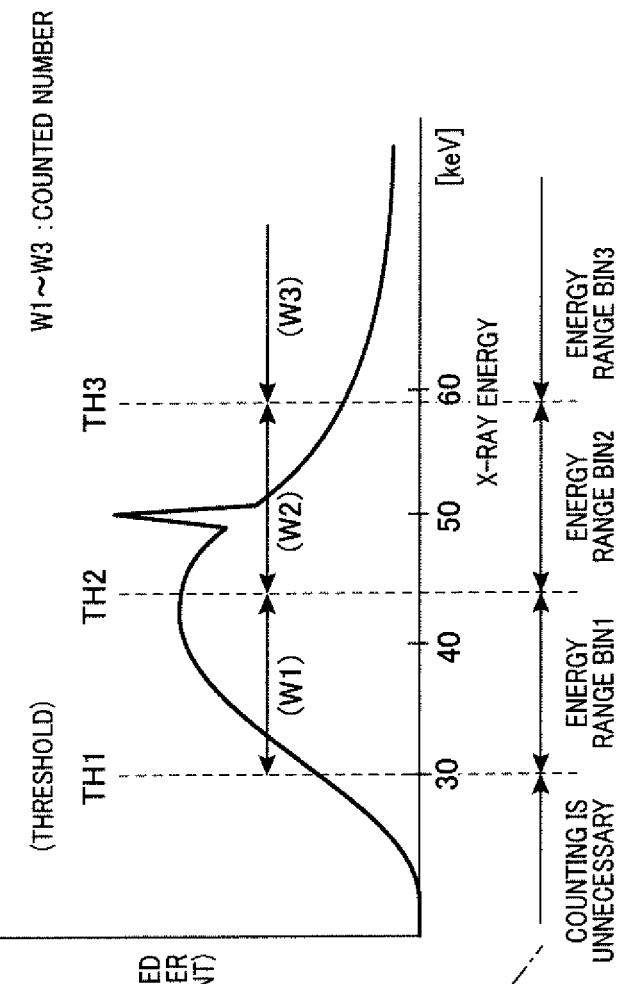
FIG. 10 provides views, in (A) and (B) thereof, of a sub-pixel according to the embodiment and photon counting X-ray detection performed for each energy region.

The energy ranges are set, as pictorially shown in (B) of FIG. 10, to have, for example, three energy ranges BIN1, BIN2 and BIN3, which are divided by X-ray photon energy [keV] scaled along the abscissa axis. Alternatively the number of energy ranges may be two or one.

Figure 11:
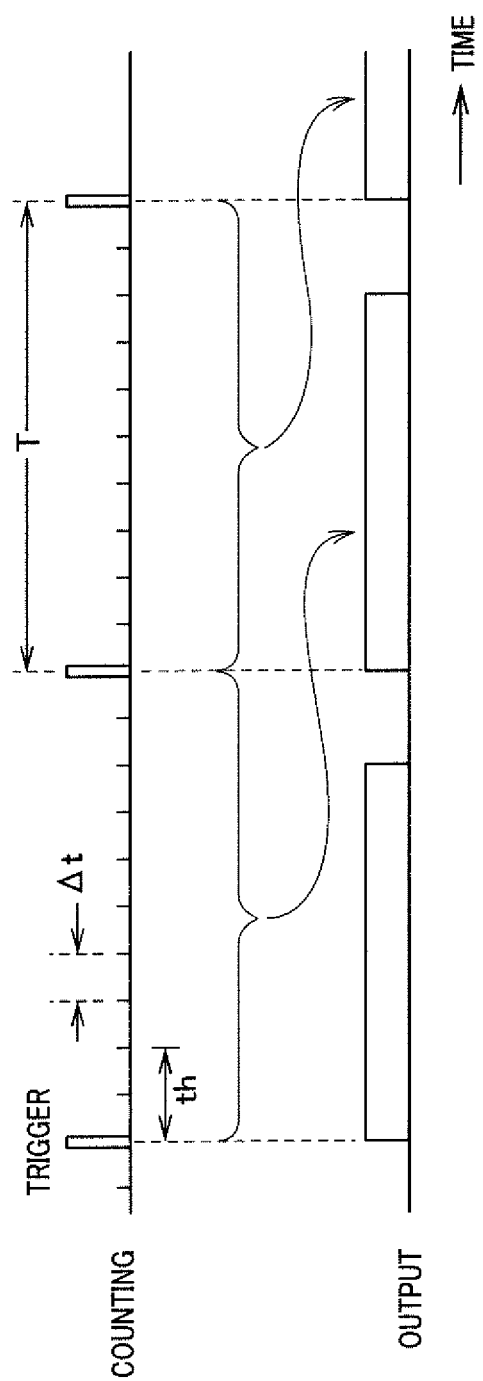
FIG. 11 is a timing chart explaining detection timing according to the embodiment.

As shown in FIG. 11, the count & addition circuit 76 performs the foregoing measurement and addition repeatedly based on a preset minute repetition time Δt, during a given cycle T (FPS) starting from input of the inhibition signal to input of the reset signal. This circuit 76 provides the added values to the output circuit 78, individually for each of the energy ranges BIN1, BIN2 and BIN3.

The sub-pixel deciding circuit 77 is provided with four counters and two comparators, and, based on comparison results by the comparators, decides in a finer manner a current X-ray incidence position (for example, a scintillating point P shown in FIG. 7). Practically, the APD cluster 52(i, j) into which the X-ray has arrived now, namely the single physical pixel, is virtually divided into ¼-size sub-pixels through the foregoing comparison calculation. Furthermore, the circuit 77 determines which X-ray incidence position positionally belongs to which of the four sub-pixels.

Figure 9:
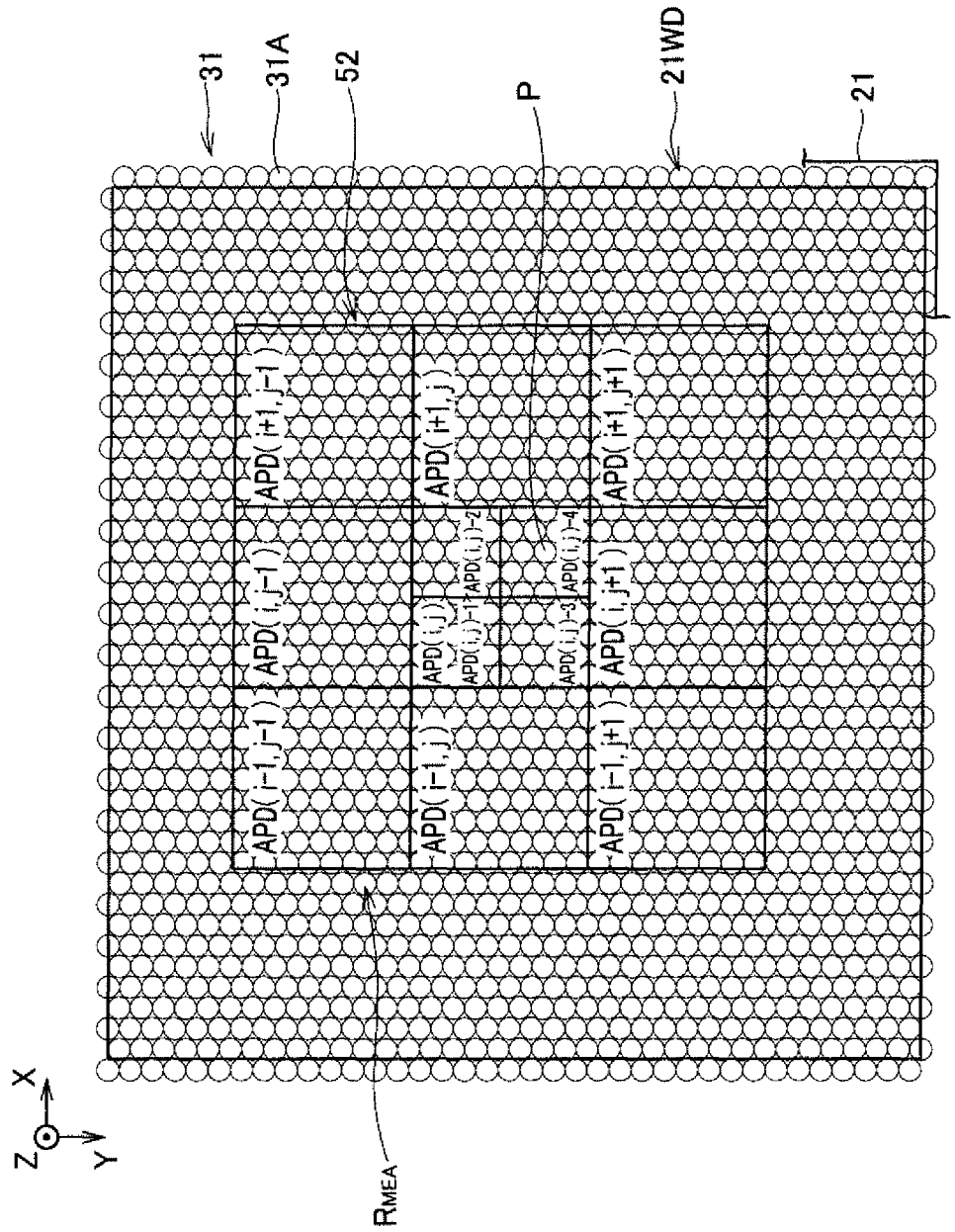
FIG. 9 is a view explaining a positional relationship between a single physical pixel and a sub-pixel produced by calculation.

For instance, in the example, shown in FIG. 9, it is assumed that, as the APD cluster 52, there is an X-ray incidence position P in the physical pixel formed by an APD cluster 52(i, j). In this example, by the four counters (not shown) of the sub-pixel deciding circuit 77, electrical pulse signals outputted from four APDs of APD(i−1, j) APD(i+1, i j), APD(i, j−1), and APD(i, j+1), which are located on front, side and rear sides, are counted for a predetermined period of time $t_k$ (refer to FIG. 11). When those counts are given as K1, K2, K3 and K4, the two comparators perform determination including comparative calculations of:

K1<K2

K3<K4

As a result, any one of the following determination results 1 to 4 will come out:

| | |
|---|---|
| K1≥K2 and K3≥K4 | deamination result 1: |
| K1<K2 and K3≥K4 | deamination result 2: |
| K1≥K2 and K3<K4, | deamination result 3: and |
| K1<K2 and K3<K4. | deamination result 4: |

That is, if the determination result 1 is produced, the X-ray incidence position P is determined as being an upper left ¼-size sub-pixel APD(i, j)−1 in the APD cluster 52(i, j). If the determination result 2 comes out, the X-ray incidence position P is determined as being an upper right ¼-size sub-pixel APD(i, j)−2, and if the determination result 3 comes out, the X-ray incidence position P is determined as being a lower left ¼-size sub-pixel APD(i, j)−3. Similarly, if the determination result 4 comes out, the X-ray incidence position P is determined as being a lower left ¼-size sub-pixel APD(i, j)−4 (refer to an illustration of FIG. 9).

The sub-pixel deciding circuit 77 converts the calculated determination result into binary information, and, as positional information of a sub-pixel, provides the output circuit 78 with the binary positional information.

The output circuit 78 is, as shown, provided with counters 78A-78C which count the number of photons for each of the energy ranges BIN1, BIN2 and BIN3, and a positional information generator 78D. Each of the counters 78A-78C is in charge of calculation for each of the energy ranges BIN1 (to BIN3) assigned respectively to the counters. Specifically, the counter 78A (to 78C) receives a count (an added value) corresponding to the number of X-ray photons from all over the measurement target region $R_{MEA}$, which is sent from the count & addition circuit 76 at every sampling time Δt, and counts the count. In addition, the positional information generator 78D receives positional information indicative of the positionally decided sub-pixel, which is sent from the sub-pixel deciding circuit 77. Accordingly, the generator 78D generates, at a resolution level corresponding to the sub-pixel size, the X-ray incidence position P on the X-ray incidence window 21WD, based on the received positional information of the decided sub-pixel and preset default positional information about each of the APD clusters 52

The output circuit 78 is configured to output outside, serially at a constant rate T (FPS), both the counts counted up by the counters 78A to 78C in each of the individual energy ranges BIN1 to BIN3 and the positional information showing the X-ray incidence position P generated by the positional information generator 78D.

As described, the detection operations can be summarized as follows:

In FIG. 7, a reference numeral 52(i, j) shows a single APD cluster 52 positionally containing a scintillator 31A which has scintillated responsively to the foregoing X-ray incidence, among the two-dimensionally arrayed plural APD clusters 52 (i.e., two-dimensionally arrayed plural pixels). The suffixes i and j show position, shown pixel by pixel, in the X-axis and Y-axis directions on the XY plane provided by the X-ray incidence window 21W.

FIG. 7 shows an event in which the X-ray has entered the position P as an incidence X-ray. In this event, in the X-ray incidence window 21WD shown in FIG. 7, the APD cluster 52 containing the scintillator 31A which has scintillated in response to the X-ray incidence is located at the third place from the left side in the X-axis direction and the third place from the upper side in the Y-axis direction. So as to surround this APD cluster 51(i, j), the region containing eight APD clusters 52(i−1, j−1), 52(i, j−1), 52(i+1, j−1), 52(i−1, j), 52(i+1, j), 52(i−1, j+1), 52(i, j+1), and 52(i+1, j+1), namely, the measurement target region $R_{IM4}$, is designated. In other words, in all, a group of the nine APD clusters 52, containing the central targeted APD cluster 52(i, j), are subjected to the forgoing signal processing including the signal addition. In this processing, the foregoing inhibited region $R_{INHIBIT}$ is designated, which is a region for excluding signals generated in the region $R_{INHIBIT}$ from being added in the signal addition processing.

Under such a condition, the signal circuit section 62 shown in FIG. 8 operates, which results in that, as shown in FIG. 10(A), an X-ray incidence position P which is finer in size than the physical pixel is decided as a sub-pixel. Concurrently, as conceptually shown in FIG. 10(B), a statistical count of the X-ray photons at the sub-pixel, which is for example P(i, j)−4, is obtained every energy range BIN1 (to BIN3). In this way, for each of the energy ranges, the photon counting type of X-ray intensity detection can be performed.

The foregoing X-ray detection for each of the APD clusters is performed at the cycle T. In each cycle of this detection, if there is another X-ray incidence into an APD cluster 52 positionally belonging to the inhibited region $R_{INHIBIT}$, the detection from the APD cluster 52 which has received another X-ray incidence is inhibited during that cycle T.

In contrast, if there is an X-ray incidence at another positon on an APD cluster 52 located outside the inhibited region $R_{INHIBIT}$, the detection will begin in another measurement target region $R_{MEA}$, because such another measurement target region $R_{MEA}$ is not overlapped with the inhibited region $R_{INHIBIT}$ now processed.

Incidentally, FIG. 7 indicates other positions P1 and P different from the foregoing exemplified X-ray incidence position P. At each of these positions P1 and P2, the foregoing detection is performed in sequence, every cycle T, by targeting an APD cluster in which each of such positions P1 and P2 is included.

In this way, the detector 11 according to the present embodiment includes, as shown in FIG. 2, the layered structure provided with the scintillation layer 31, the optical connecting layer 32, a photoelectric conversion layer 33 having the APD clusters 52, and the processing circuit layer 34. With the same-layered structural configuration directed to different applications, it is still possible to apply this detector to such applications by adjusting the thickness Lopt of the optical connecting layer 32, regardless of amounts in the number of photons. Such applications include X-ray beams radiated by X-ray tubes, gamma rays emitted from nuclide administered in a patient body, and weak fluorescence excited by excitation light. That is, in terms of balance between two parameters consisting of a desired resolution level and an accuracy degree desired for counting the photons, both the pixel size and the thickness Lopt of the optical connecting layer 32 can be decided. In other words, this thickness Lopt can be decided depending on a perspective of detecting pulsed light spreading with a solid angle and diffusing into the optical connecting layer 32 by using how many APD clusters 52 centering a scintillating point, with a shared manner among the APD clusters and with no failure detection.

Accordingly, by employing the layered structure according to the embodiment into the detector, it is possible to provide easily versatile detectors which enable detection of not only gamma rays but also X-rays, and weak excited light, which can thus be used by various medical modalities.

In the foregoing embodiment, the sub-pixel deciding circuit 77 can be omitted from being arranged, which means that, with the sizes of the physical pixels kept without being converted to sub-pixels, the number of photons is counted for every energy range.

[Modifications]

The detector 11 according to the foregoing embodiment has been described as an example provided with the processing circuit layer 31, but the sensor portion will not be limited to this structure. For example, there can be an alternatively structured detector in which ultraviolet light, visible light or X-rays may be adopted as the excitation light being radiated to fluorescent substances such that the excitation allows weak light (fluorescence, phosphorescence, or other weak light) emitted from the fluorescence substance to be detected.

An example showing a weak light detector 81 is shown in FIG. 12, in which, instead of employing the foregoing scintillation layer, a fiber optic plate (FOP) 82 is mounted. This fiber optic plate 82 is mainly composed of a plurality of constant-length optical fibers 82A are disposed closely and adjacently to each other. The remaining configurations are the same or equivalent as or to those shown in FIG. 2.

This weak light detector 81 is able to work as a higher-sensitivity optical two-dimensional sensor with an optical directivity. For this sensing, the fiber optic plate 82 has a front (i.e., an incidence window 21WD) through which excited weak light is allowed to be incident within the directivity. The incident weak light is propagated in the optical fibers 82A and emitted as a spread (diffused) light into the forgoing optical connecting layer 32. The spread light then hits one or more APD clusters 52, in the same manner as that described.

In this detector, similarly to the forgoing, depending on a range of intensity of incident weak light, the thickness Lopt of the optical connecting layer 32, the size of the measurement target region RMEA, and the size of the inhibited region $R_{INHIBIT}$ can be optimized in consideration of desired levels of both resolution and accuracy of counting the number of photons. If being dedicated to detecting the weak light, the signal circuit section 62 can be simplified more than the foregoing, because it is sufficient to detect only positions and intensities of the weak light. For example, the comparator 71, counter 72, and before/after determining circuit 73 may be omitted from the circuitry, and/or the sub-pixel deciding circuit 77 may be omitted therefrom. It may be configured simply such that information showing both an optical position at which incidence of the light is first made and the intensity of the light at the first position is repeatedly outputted every pixel at a constant frame rate.

Hence, even if an assumption is made which only the weak light is detected (that is, in imaging in which a CCD sensor or a CMOS sensor cannot be employed or a wider dynamic range is desired), near-distance imaging is performed from a closely approaching positon to an object, linearly-incident light should selected, or an especially improved resolution level is required, it is possible to provide a detector which estimates both excitation positions of light excited and amounts of the excited light. Additionally, with consideration of such characteristics, this exemplified weak light detector can be applied to dark-field cameras or optical tomography.

REFERENCE SIGNS LIST 11 photon counting detector (photon counting type radiation detector)
12 controller
15 processor
21 case
21WD X-ray incidence window
31 scintillation layer (columnar-body array)
31A scintillator
32 optical connection layer (optical connector)
33 photoelectric converting layer (APD cluster group)
34 processing circuit layer (processing circuit)
51 APD (avalanche photodiode)
52 (APD cluster)
61 signal processing circuit
62 signal circuit section signal circuit section
81 weak light detector (photon counting detector)
82 fiber optic plate (FOP) (columnar-body array)
82A optical fiber
$R_{MEA}$ measurement target region
$R_{INHIBIT}$ inhibited region

What is claimed is:

1. A photon counting detector, comprising:
a columnar-body array provided with a plurality of columnar bodies mutually densely and adjacently arranged, each of the columnar bodies receiving incident radiation or light, the incident radiation being converted to light or the incident light being transmitted in one direction therealong, each of the columnar bodies having an emission end surface through which the converted light or the transmitted light is emitted outside, the emission end surfaces of the columnar bodies forming an emission surface;
an optical connector formed to be opposed to the emission surface of the columnar-body array, the optical connector being able to adjust a range of spread of the light emitted from the emission end surface of each of the columnar-body members;
a group of APD clusters arranged to be opposed to the emission surface via the optical connector and formed by a plurality of APD clusters arranged two-dimensionally, each of the APD clusters serving as one pixel and being formed by N×N (N is a positive integer of 2 or more) avalanche photodiodes (APD) having a light receiving face, the N×N avalanche photodiodes being arranged two-dimensionally and providing output signals electrically combined by a wired OR circuit;
a processing circuit processing an electrically combined output signal by the wired OR circuit of each of the plurality of APD clusters,
wherein
the optical connector is configured such that the range of spread of the light emitted from the emission end face of each of the columnar bodies is spread over, at least, the light receiving faces of the N×N pieces of APDs configuring the individual APDs, and
the processing circuit comprises
a plurality of measurement circuits, each of the measurement circuits being provided for each of the APD clusters, each of the measurement circuits being able to measure, as the number of photons of the light, energy of the emitted light in each of a plurality of divided energy ranges for a predetermined period of time, based on the output signal provided from each of the plurality of APD clusters;
an addition circuit adding, so as to produce a sum, counts counted by a plurality of measurement circuits designated among the measurement circuits, the sum of the counts being regarded as the scintillation light generated by a substantial single pulse of the radiation, a single APD cluster being designated as a scintillation center APD cluster and being one of the APD clusters connected to one of the measurement circuits which has firstly counted up a given number of electrical pulses, the plurality of the designated measurement circuits being connected to a given number of APD clusters designated among the APD clusters, the given number of APD clusters being located around the scintillation center APD;
inhibition commanding means commanding the given number of APD clusters located around the single APD cluster, to inhibit counting the photons entering the given number of APD clusters located around the single APD cluster, for a predetermined period of time during which the signal measurement circuit connected to the single APD cluster is counting;
inhibition means arranged in each of the plurality of measurement circuits, the inhibition means inhibiting counting of the measurement circuits when the inhibition commanding means issue a command for inhibiting the counting;
positional information calculating means calculating positional information of the scintillation based on the scintillation center APD cluster; and
an output circuit outputting positional information indicative of the scintillation center APD cluster and information indicative of the number of photons of the radiation, at least, in each of the energy ranges.

2. The photon counting detector according to claim 1, wherein
each of the columnar bodies is structured such that the body receives the incident radiation, generates scintillation light depending on the radiation, and emits the scintillation light from the emission end face; and
the columnar-body array is formed as a scintillator which emits, toward the group of APD clusters, via the optical connector, the scintillation light depending on an amount of the incident radiation from the emission surface, for every one of the columnar bodies.

3. The photon counting detector according to claim 2, wherein
each of the columnar bodies comprises an incidence end face located oppositely to the emission end face in an axial direction of the columnar bodies; and
the incidence end face of each of the plurality of columnar bodies is provided as part of an incidence surface of the scintillator, the incidence surface receiving the incidence of the radiation, the incidence the scintillator.

4. The photon counting detector according to claim 3, wherein
each of the columnar bodies has a diameter of a few dozen of micrometers, preferably, 20 μm;
the one side has a length of 10 μm;
the "N×N" pieces are 15×15 pieces;
each of the APD clusters, which is combined by the wired logical addition circuit, is less than 200 μm ×200 μm, preferably, 150 μm ×150 μm;

a duration for counting the number of photons is a time period during which one pulse of the radiation is regarded as being decayed sufficiently; and the given number of APD clusters located around the single APD cluster is eight in number, the eight APD clusters being located on four sides of the single APD cluster.

5. The photon counting detector according to claim 4, wherein the positional information calculating means comprises comparison means mutually comparing the number of photons outputted from the APD clusters located around the single APD cluster so as to virtually divide the single APD cluster into a plurality of sub-clusters, the positional information calculating means decides that the scintillation center is located at one of the plurality of sub-clusters based on a compared result in the comparison means, and outputs a position of the decided sub-cluster as the positional information of the scintillation.

6. The photon counting detector according to claim 5, wherein the respective columnar bodies of the scintillator are set to be longer in the axial direction thereof, a thickness of the optical connector, which is between the scintillator and the group of APD clusters, is set to be larger, and the size of the respective APD clusters is set to be larger effectively, as energy of the radiation being detected is higher.

7. The photon counting detector according to claim 6, wherein the scintillator, the optical connector, and the group of APD clusters, and the processing circuit are structured as a module of a predetermined size;

the detector comprises optical shielding means arranged on, at least, an outer periphery of the scintillator and an outer periphery of the optical connector, the optical shielding means shielding against incidence of external light; and the plurality of columnar bodies of the scintillator and the group of the APD clusters have a dead space provided between the bodies and between the clusters, the dead space emitting no light and being made smaller than a size of the pixel.

8. The photon counting detector according to claim 3, wherein the scintillator has a light attenuation time of equal to or less than 25 ns and a specific gravity of 5 or more.

9. The photon counting detector according to claim 3, wherein the positional information calculating means comprises comparison means mutually comparing the number of photons outputted from the APD clusters located around the single APD cluster so as to virtually divide the single APD cluster into a plurality of sub-clusters, the positional information calculating means decides that the scintillation center is located at one of the plurality of sub-clusters based on a compared result in the comparison means, and outputs a position of the decided sub-cluster as the positional information of the scintillation.

10. The photon counting detector according to claim 9, wherein the respective columnar bodies of the scintillator are set to be longer in the axial direction thereof, a thickness of the optical connector, which is between the scintillator and the group of APD clusters, is set to be larger, and the size of the respective APD clusters is set to be larger effectively, as energy of the radiation being detected is higher.

11. The photon counting detector according to claim 10, wherein the scintillator, the optical connector, and the group of APD clusters, and the processing circuit are structured as a module of a predetermined size;

the detector comprises optical shielding means arranged on, at least, an outer periphery of the scintillator and an outer periphery of the optical connector, the optical shielding means shielding against incidence of external light; and the plurality of columnar bodies of the scintillator and the group of the APD clusters have a dead space provided between the bodies and between the clusters, the dead space emitting no light and being made smaller than a size of the pixel.

12. The photon counting detector according to claim 2, wherein the positional information calculating means comprises comparison means mutually comparing the number of photons outputted from the APD clusters located around the single APD cluster so as to virtually divide the single APD cluster into a plurality of sub-clusters, the positional information calculating means decides that the scintillation center is located at one of the plurality of sub-clusters based on a compared result in the comparison means, and outputs a position of the decided sub-cluster as the positional information of the scintillation.

13. The photon counting detector according to claim 2, wherein the respective columnar bodies of the scintillator are set to be longer in the axial direction thereof, a thickness of the optical connector, which is between the scintillator and the group of APD clusters, is set to be larger, and the size of the respective APD clusters is set to be larger effectively, as energy of the radiation being detected is higher.

14. The photon counting detector according to claim 2, wherein the scintillator, the optical connector, and the group of APD clusters, and the processing circuit are structured as a module of a predetermined size;

the detector comprises optical shielding means arranged on, at least, an outer periphery of the scintillator and an outer periphery of the optical connector, the optical shielding means shielding against incidence of external light; and the plurality of columnar bodies of the scintillator and the group of the APD clusters have a dead space provided between the bodies and between the clusters, the dead space emitting no light and being made smaller than a size of the pixel.

15. The photon counting detector according to claim 2, wherein the columnar bodies of the scintillator are made of CeLaCl3.

16. The photon counting detector according to claim 1, wherein each of the columnar bodies is composed of an optical fiber; and the columnar-body array is provided as a fiber optic plate (FOP) having the emission surface, the fiber optic plate being produced by combining a plurality of the optical fibers closely and adjacently to each other.

17. The photon counting detector according to claim 1, wherein the processing circuit is structured as an ASIC.

18. The photon counting detector according to claim 1, wherein
> the light receiving face of each of the ADPs is formed as rectangle having a one side which is smaller than a length of a section of the respective columnar bodies, the section being perpendicular to the respective columnar bodies.

\* \* \* \* \*